US009291912B2

(12) United States Patent
Mochizuki et al.

(10) Patent No.: US 9,291,912 B2
(45) Date of Patent: Mar. 22, 2016

(54) EXPOSURE APPARATUS AND METHOD OF MANUFACTURING ARTICLE

(71) Applicant: CANON KABUSHIKI KAISHA, Tokyo (JP)

(72) Inventors: Shinya Mochizuki, Utsunomiya (JP); Yuji Maehara, Saitama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 180 days.

(21) Appl. No.: 13/966,512

(22) Filed: Aug. 14, 2013

(65) Prior Publication Data

US 2014/0055766 A1   Feb. 27, 2014

(30) Foreign Application Priority Data

Aug. 21, 2012 (JP) ................. 2012-182643

(51) Int. Cl.
| | |
|---|---|
| G02B 7/02 | (2006.01) |
| G02B 7/182 | (2006.01) |
| G03B 27/32 | (2006.01) |
| G03B 27/52 | (2006.01) |
| G03B 27/54 | (2006.01) |
| G03F 7/20 | (2006.01) |

(52) U.S. Cl.
CPC .............. *G03F 7/7015* (2013.01); *G02B 7/025* (2013.01); *G03F 7/70825* (2013.01)

(58) Field of Classification Search
CPC .......... G02B 7/02; G02B 7/022; G02B 7/025; G02B 7/026; G03F 1/14; G03F 7/7015; G03F 7/70825; G03F 7/70841; G03F 7/70883; G03F 7/70908; G03F 7/70916

USPC .................. 355/30, 67, 77; 359/819, 871
See application file for complete search history.

(56) References Cited

U.S. PATENT DOCUMENTS

| | | | | |
|---|---|---|---|---|
| 5,781,351 | A * | 7/1998 | Murakami et al. ............ | 359/808 |
| 2004/0046008 | A1* | 3/2004 | Raghavan et al. ............ | 228/214 |
| 2005/0122600 | A1* | 6/2005 | Yoshizawa .................... | 359/819 |
| 2011/0299180 | A1* | 12/2011 | Yen ................................ | 359/819 |
| 2012/0120378 | A1* | 5/2012 | Chung ........................... | 355/30 |

FOREIGN PATENT DOCUMENTS

| | | | | |
|---|---|---|---|---|
| JP | 11014876 | A * | 1/1999 | ............... G02B 7/00 |
| JP | 2005-134672 | A | 5/2005 | |
| JP | 2005148254 | A | 6/2005 | |
| JP | 2006-066836 | A | 3/2006 | |

OTHER PUBLICATIONS

Office Action issued in KR10-2013-0097627, mailed Jan. 14, 2016.

* cited by examiner

*Primary Examiner* — Colin Kreutzer
(74) *Attorney, Agent, or Firm* — Rossi, Kimms & McDowell LLP

(57) ABSTRACT

An exposure apparatus includes an optical system configured to expose a substrate. The optical system includes an optical member, a holding portion which holds the optical member, a pressing portion which presses the holding portion and the optical member against each other, and a sealed adhesive material which is filled in a space formed by the optical member and the holding portion pressed against each other, and adheres the optical member and the holding portion to each other.

17 Claims, 6 Drawing Sheets

EXPOSURE APPARATUS AND METHOD OF MANUFACTURING ARTICLE

BACKGROUND OF THE INVENTION

1. Field of the Invention

The present invention relates to an exposure apparatus and a method of manufacturing an article.

2. Description of the Related Art

An exposure apparatus which projects and transfers a pattern formed on an original onto a substrate by a projection optical system is employed to manufacture an article such as a microdevice using the photolithography technique. The resolution of an image to be projected depends on the wavelength of exposure light, and the numerical aperture (HA) of the projection optical system, so the shorter the wavelength, and the larger the numerical aperture, the higher the obtained resolution becomes.

As a demand for miniaturizing formed elements has arisen, the wavelength of exposure light has shortened. More specifically, the wavelength of exposure light is shorter in the order of an ultra-high pressure mercury lamp (i-line (wavelength: about 365 nm)), a KrF excimer laser (wavelength: about 248 nm), and an ArF excimer laser (wavelength: about 193 nm). However, the photolithography technique which uses ultraviolet exposure light cannot cope with further miniaturization. Hence, to transfer a pattern as very fine as 0.1 µm or less at a high resolution, an exposure apparatus which uses EUV (Extreme Ultraviolet) light with a wavelength of about 5 nm to 15 nm shorter than that of ultraviolet light has been developed. Such an exposure apparatus is called an EUV exposure apparatus. An optical system of the EUV exposure apparatus is formed by a plurality of optical members (total reflection mirrors). In the EUV exposure apparatus, the requirement for the stability (positioning reproducibility) of the position and attitude of each optical member is very high to project a pattern at a high resolution.

Japanese Patent Laid-Open No. 2006-66836 describes a supporting structure for an optical member. The optical member has a flange portion on its periphery. A ball press ring which supports the optical member includes an annular frame member, three supporting portions arranged on one surface of the frame member to have an angular pitch of 120°, and a parallel-plate spring which connects the frame member and supporting member to each other. The optical member is fixed to the supporting member by adhering a bridge member to the side surface of its flange portion and that of the supporting member by an adhesive agent while the flange portion is disposed on the supporting member.

In a configuration in which the optical member is fixed by the adhesive agent, a problem resulting from generation of a gas from the adhesive agent is posed. Such a gas is called outgas. In, for example, an EUV exposure apparatus, outgas may become a factor which absorbs EUV light from a light source. Also, outgas may adhere to the surface of the optical member to form a film, or form a reaction product with other substances and adhere to the surface of the optical member. This may become a factor which shortens the life of the optical member.

SUMMARY OF THE INVENTION

The present invention provides an exposure apparatus advantageous in terms of high positioning reproducibility and little outgas.

One of aspects of the present invention provides an exposure apparatus including an optical system configured to expose a substrate, the optical system comprising: an optical member; a holding portion which holds the optical member; a pressing portion which presses the holding portion and the optical member against each other; and a sealed adhesive material which is filled in a space formed by the optical member and the holding portion pressed against each other, and adheres the optical member and the holding portion to each other.

Further features of the present invention will become apparent from the following description of exemplary embodiments with reference to the attached drawings.

DESCRIPTION OF THE EMBODIMENTS

Exemplary embodiments of the present invention will be described below with reference to the accompanying drawings.

Figure 1A:
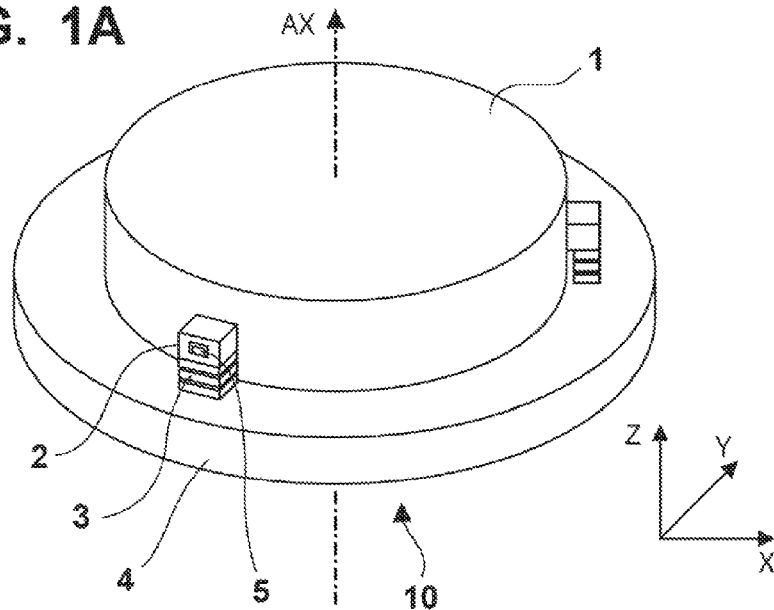
FIGS. 1A and 1B are views for explaining an optical apparatus according to the first embodiment of the present invention.
Figure 1B:
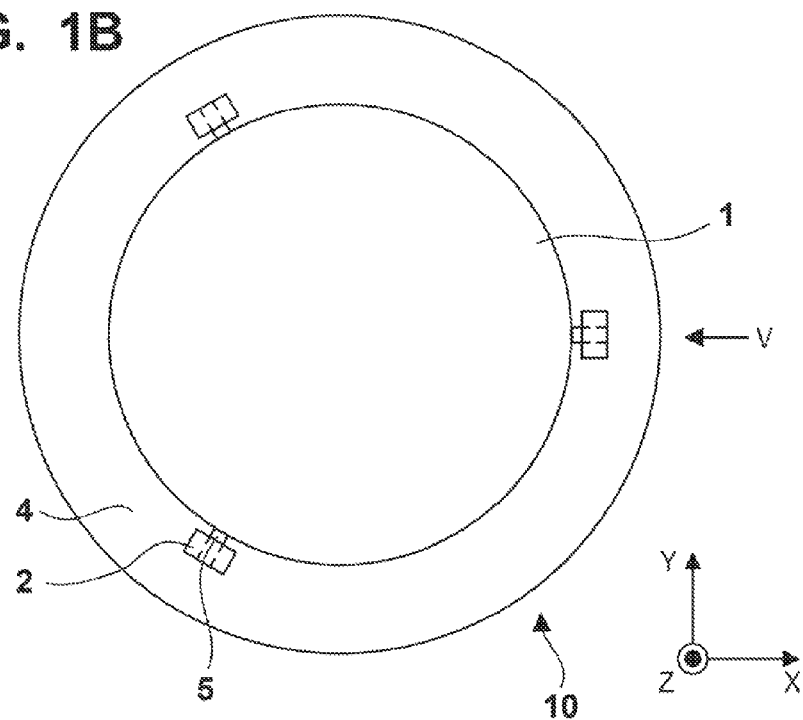
Figure 2:
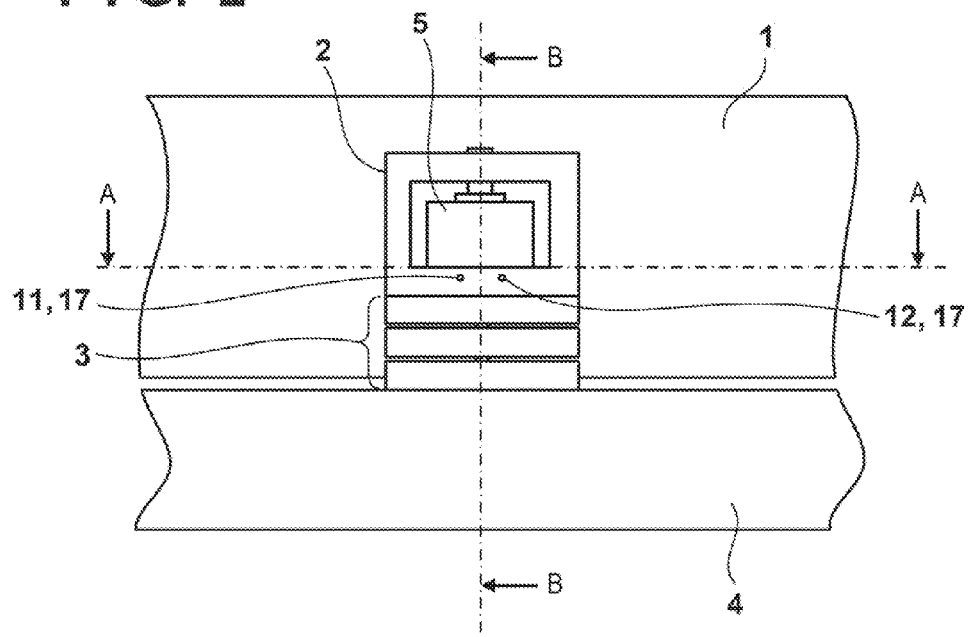
FIG. 2 is a view for explaining the optical apparatus according to the first embodiment of the present invention.
Figure 3:
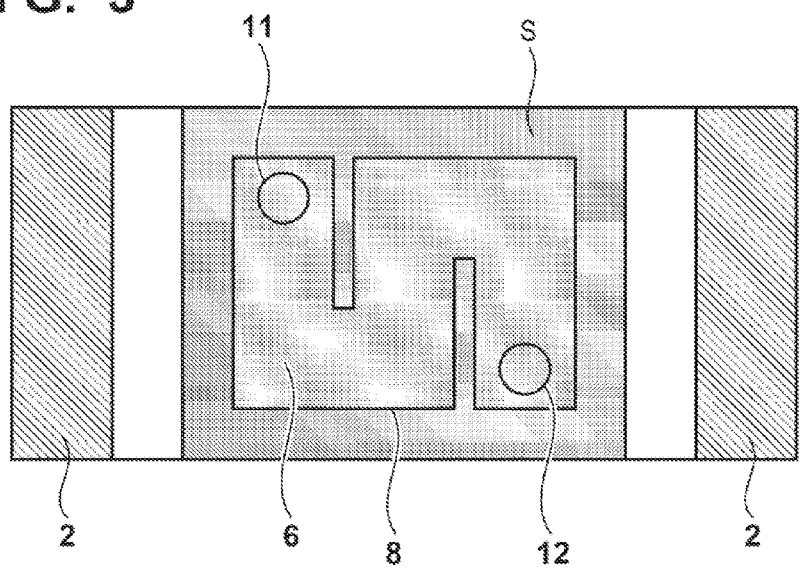
FIG. 3 is a view for explaining the optical apparatus according to the first embodiment of the present invention.
Figure 4:
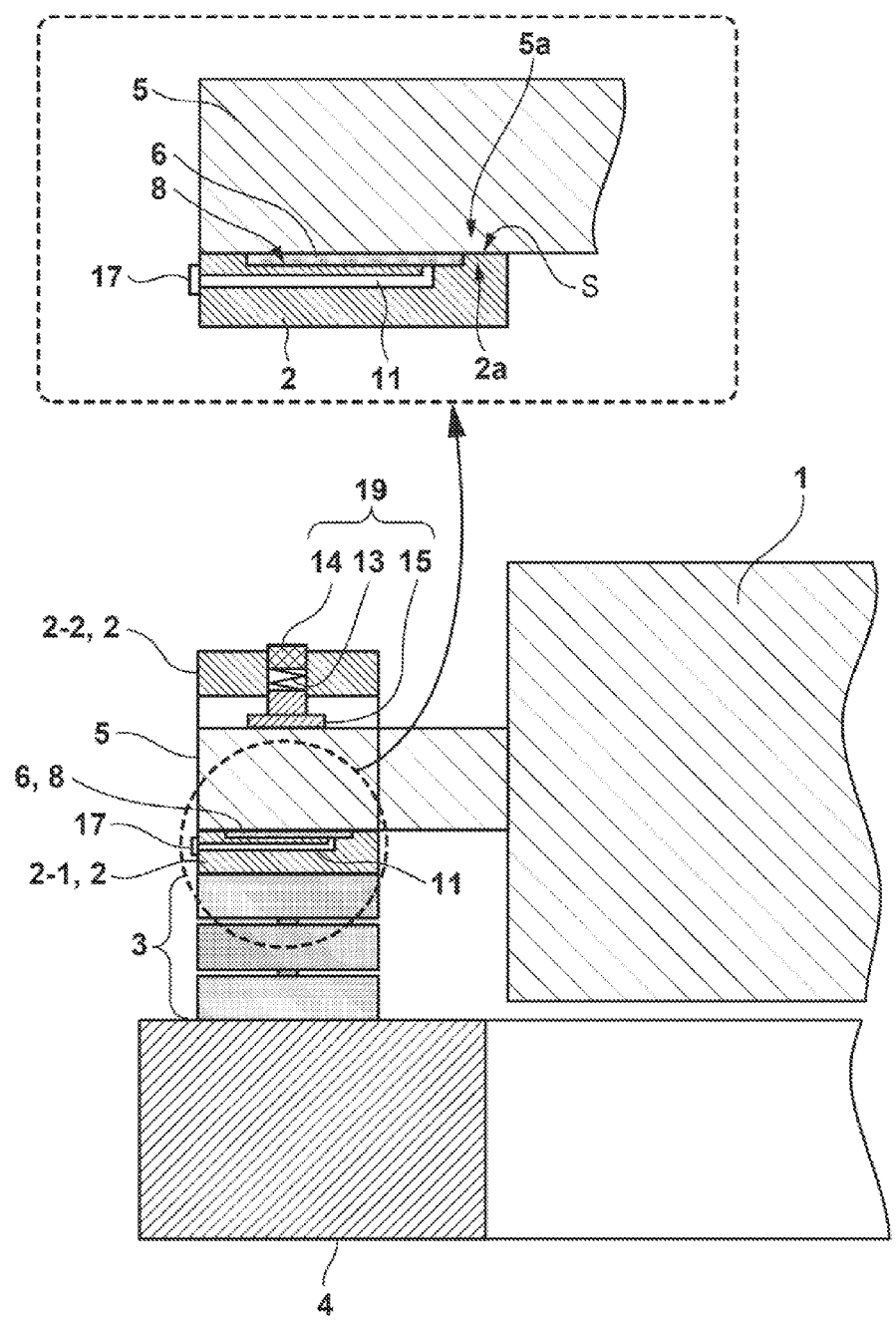
FIG. 4 is a view for explaining the optical apparatus according to the first embodiment of the present invention.

The first embodiment of the present invention will foe described first with reference to FIGS. 1A, 1B, and 2 to 4. FIGS. 1A and 1B are a perspective view and plan view, respectively, schematically showing the configuration of an optical apparatus 10 according to the first embodiment. FIG. 2 is a partial side view of the optical apparatus 10 as viewed from a direction indicated by an arrow V shown in FIG. 1B. FIG. 3 is a sectional view taken along a line A-A in FIG. 2. FIG. 4 is a sectional view taken along a line B-B in FIG. 2. Referring to FIGS. 1A and 1B, an X-Y-Z coordinate system is defined to have the Z-direction in an optical axis direction AX of the optical apparatus 10.

The optical apparatus 10 includes an optical member 1, and holding portions 2 which hold the optical member 1. The optical member 1 has a reflecting surface, on which light can be perpendicularly incident. The optical member 1 can include a plurality of held portions 5. In an example shown in FIGS. 1A and 1B, the optical member 1 includes three held portions 5, which are arranged to have an angular pitch of 120°. The held portion 5 can have, for example, a protruding shape, but this is merely an example, and the held portion 5 need only have a shape which can support the body portion of the optical member 1 (a portion other than the held portion 5). The optical apparatus 10 includes holding portions 2 equal in number to the held portions 5, and each holding portion 2 holds the corresponding held portion 5 to hold the optical member 1.

The optical apparatus 10 can further include supporting portions 3 which support the holding portions 2. The number of holding portions 2 can be equal to that of supporting portions 3. The supporting portion 3 can include, for example, an elastic hinge, leaf spring, or bipod. The supporting portion 3 can be formed by a low thermal expansion material such as Inver.

The holding portion 2 and supporting portion 3 may be formed integrally with or bonded to each other by a bonding member (for example, a screw or an adhesive agent). The supporting portions 3 can be supported by a base member 4. The base member 4 can be bonded to a lens barrel member of an optical system (for example, a projection optical system of an exposure apparatus). The base member 4 can have a ring or polygonal shape.

The base member 4 can have a stiffness high enough not to deform the optical member 1 upon reception of an external force. The base member 4 is preferably formed by a low thermal expansion material, and more preferably formed by a material with a thermal expansion coefficient nearly equal to that of the optical member 1. An actuator which drives the optical member 1, and/or a sensor which detects the position of the optical member 1 can he attached to the base member 4.

The holding portion 2 is formed by a low thermal expansion material with a thermal expansion coefficient nearly equal to that of the optical member 1, such as Inver. The optical member 1 (more specifically, the held portion 5) and holding portion 2 are bonded to each other by an adhesive material 6, as illustrated in FIGS. 3 and 4. The adhesive material 6 can be formed by, for example, an epoxy adhesive agent. The adhesive material 6 is filled in a space 8, formed between the held portion 5 of the optical member 1 and the holding portion 2, so as to bond the held portion 5 of the optical member 1 and the holding portion 2 to each other. The space 8 can be formed by a groove formed in at least one of the held portion 5 and holding portion 2. In an example shown in FIG. 4, the space 8 is formed by a groove formed in the holding portion 2. A seal portion S which seals the adhesive material 6 is disposed between the held portion 5 and the holding portion 2.

The seal portion S can be formed by, for example, contact between a held surface 5a of the held portion 5 and a holding surface 2a of the holding portion 2. A seal portion S with good seal properties is obtained by setting, for example, the flatness of the held surface 5a of the held portion 5 and the holding surface 2a of the holding portion 2 to 3 µm, and their surface roughness to 0.8. The width of the thus formed seal portion S is preferably 2 mm or more. The adhesive agent which forms the adhesive material 6 does not enter the seal portion S. The optical member 1 can be positioned with respect to the holding portion 2 with high accuracy by forming the seal portion S by contact between the held surface 5a of the held portion 5 and the holding surface 2a of the holding portion 2. In addition, gas emission to the outside (that is, the space accommodating the optical member 1) of the seal portion S from the adhesive material 6 can be suppressed.

The thickness of the adhesive material 6 (the height of the space 8) is preferably about 0.5 mm in terms of degradation in positioning accuracy of the optical member 1 with respect to the holding portion 2 by expansion of the adhesive material 6 due to heat, or ease in injecting an adhesive agent for forming the adhesive material 6 into the space 8. In general, as the thickness of the adhesive material 6 increases, the amount of deformation of the adhesive material 6 due to heat increases. Also, as the thickness of the adhesive material 6 increases, it becomes harder to inject an adhesive agent for forming it into the space 8 without generating air bubbles. The stiffness of the adhesive material 6 is lower than that of the holding portion 2, so the influence that the adhesive material 6 has on the positioning accuracy of the optical member 1 with respect to the holding portion 2 must be limited.

An operation for placing the adhesive material 6 in the space 8 can be done using holes (an injection hole 11 and ejection hole 12), which communicate with the space 8, while the holding surface 2a of the holding portion 2, and the held surface 5a of the held portion 5 of the optical member 1 are in contact with each other. More specifically, an adhesive agent can be injected into the space 8, for forming the adhesive material 6, through the injection hole 11. An excess of adhesive agent (that is, an adhesive agent overflowing the space 8) with a volume higher than that of the space 8 can be ejected through the ejection hole 12. After the injection of an adhesive agent into the space 8 ends, the injection hole 11 and ejection hole 12 can be obstructed by an obstructing portion 17. By providing the obstructing portion 17, a gas generated by the adhesive material 6 can be prevented from being emitted to the outside (that is, the space filled with the optical member 1) of the seal portion S through the injection hole 11 and ejection hole 12.

When holes such as the injection hole 11 and ejection hole 12 are not formed, after they are filled with an adhesive agent equal in volume to the space 8, the held portion 5 of the optical member 1 can be positioned on the holding portion 2 to bond the holding portion 2 and the held portion 5 to each other using the adhesive agent.

The optical apparatus 10 includes a pressing portion 19 which presses the holding portion 2 and optical member 1 against each other. In the first embodiment, the holding portion 2 includes a first portion 2-1 having the holding surface 2a, and a second portion 2-2 opposed to the first portion 2-1, as illustrated in FIG. 4. The space 8 filled with the adhesive material 6 is formed between the holding surface 2a of the first portion 2-1 and the held portion 5 of the optical member 1. The pressing portion 19 is attached to the second portion 2-2 to press the held portion 5 of the optical member 1 against the holding surface 2a of the first portion 2-1.

The pressing portion 19 can include, for example, a fixed portion 14 fixed to the second portion 2-2, a slidable portion 15 slidably supported by the second portion 2-2, and a spring (elastic member) 13 disposed between the fixed portion 14 and the slidable portion 15. The fixed portion 14 can be fixed to the second portion 2-2 by, for example, thread grooves formed in the second portion 2-2 and fixed portion 14.

A force that allows the pressing portion 19 to press the holding portion 2 and optical member 1 against each other can be determined by the spring 13, and can be set to that sufficient to prevent expansion of the adhesive material 6 due to a change in temperature. In an example, the maximum temperature received by the optical member 1 can be a temperature used in annealing in the step of forming a film on the surface of the optical member 1. This temperature can be, for example, 80° C. In this case, a force that allows the pressing portion 19 to press the holding portion 2 and optical member 1 against each other can be set to that which can suppress expansion of the adhesive material 6 at 80° C.

Although a force that allows the pressing portion 19 to press the holding portion 2 and optical member 1 against each other is parallel to the Z-direction (optical axis direction AX) in the first embodiment, the present invention is not limited to this, and this force may act in another direction.

Figure 5A:
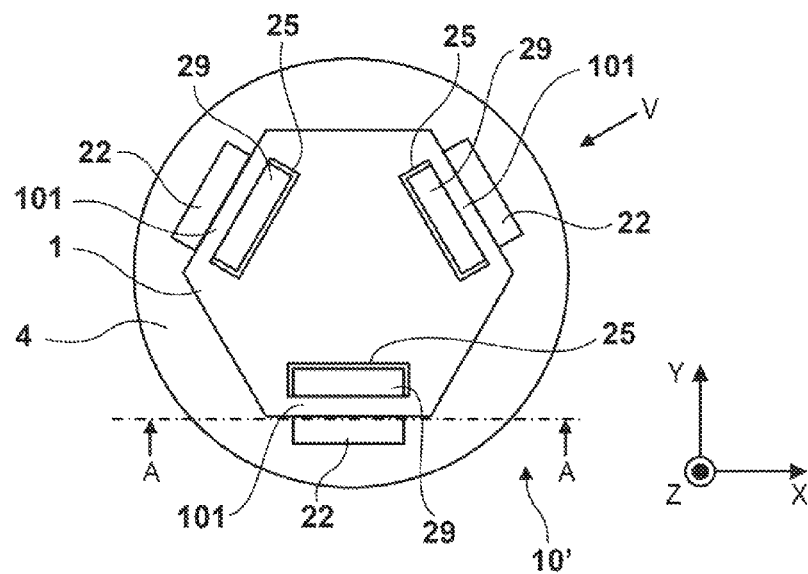
FIGS. 5A and 5B are views for explaining an optical apparatus according to the second embodiment of the present invention.
Figure 5B:
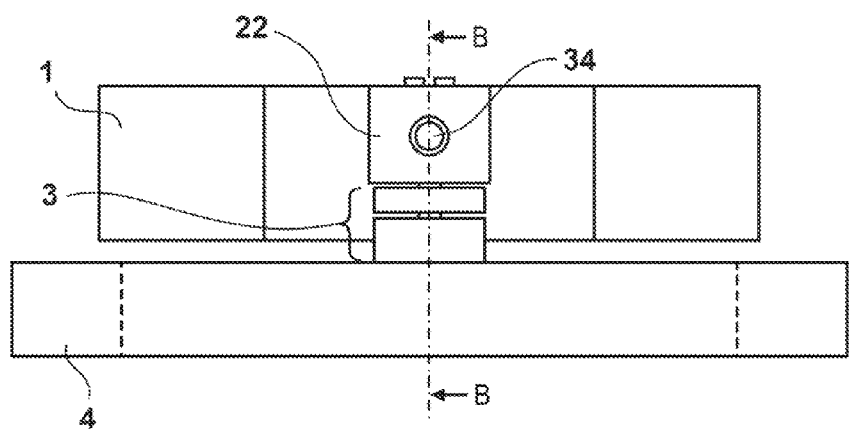
Figure 6A:
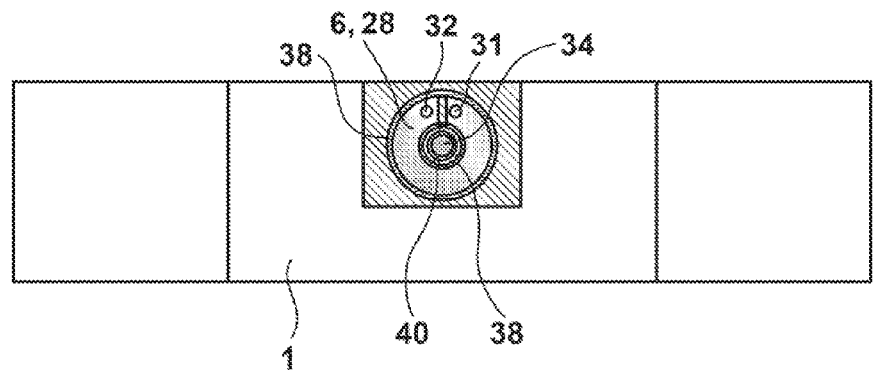
FIGS. 6A and 6B are views for explaining the optical apparatus according to the first embodiment of the present invention.
Figure 6B:
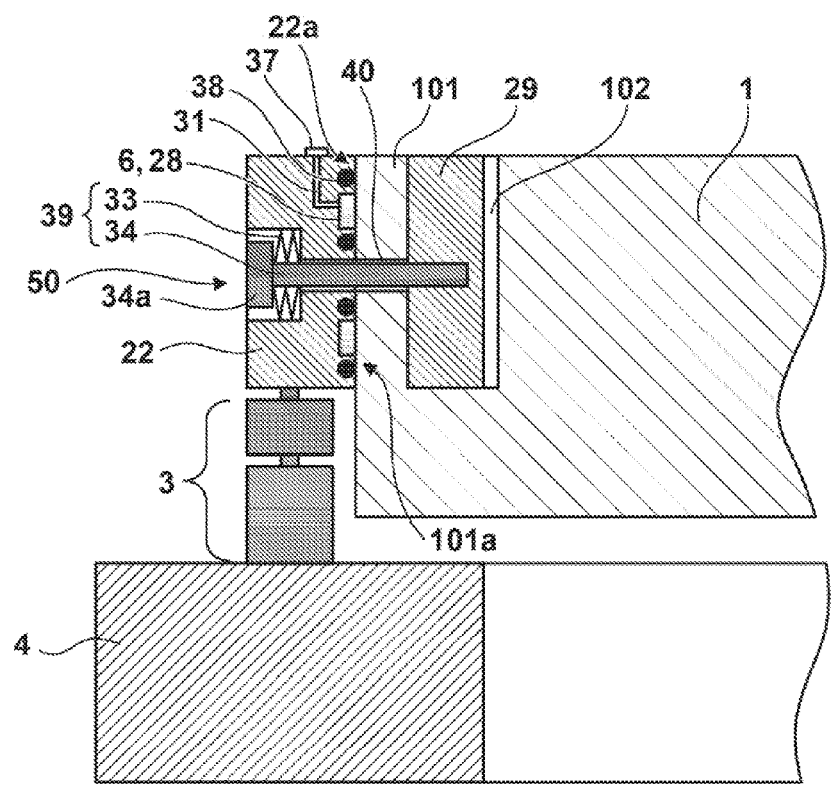

The second embodiment of the present invention will be described below with reference to FIGS. 5A, 5B, 6A, and 6B. FIGS. 5A and 5B are a plan view and side view, respectively, schematically showing the configuration of an optical apparatus 10' according to the second embodiment. Note that FIG. 5B is a partial side view of the optical apparatus 10' as viewed from a direction indicated by an arrow V shown in FIG. 5A. FIG. 6A is a sectional view taken along a line A-A in FIG. 5A. FIG. 6B is a sectional view taken along a line B-B in FIG. 5B. Details which are not particularly referred to in the second embodiment can be the same as in the first embodiment.

The optical apparatus 10' includes an optical member 1, and holding portions 22 which hold the optical member 1. The optical member 1 can be formed by, for example, a total reflection mirror. In an example shown in FIG. 5A, the optical member 1 includes three held portions 101, which are arranged to have an angular pitch of 120°.

The optical member 1 includes a concave portion 102 inside a held surface 101a, and the held portion 101 is disposed between the held surface 101a and the concave portion 102, as illustrated in FIGS. 5A and 6B.

The optical member 1 (more specifically, the held portions 101) and holding portion 22 are bonded to each other by an adhesive material 6, as illustrated in FIG. 6B. The adhesive material 6 can be formed by, for example, an epoxy adhesive agent. The adhesive material 6 is filled in a space 28, formed between the held portion 101 of the optical member 1 and the holding portion 22, so as to bond the held portion 101 of the optical member 1 and the holding portion 22 to each other. The space 28 can be formed by a groove formed in at least one of the held portion 101 and holding portion 22. In an example shown in FIG. 6B, the space 28 is formed by a groove formed in the holding portion 22. The space 28 can have, for example, a ring shape, as illustrated in FIG. 6A.

A seal portion 38 is formed between the held portions 101 and the holding portion 22 to surround the adhesive material 6. The seal portion 38 can be formed by, for example, an O-ring (made of, for example, fluororesin). Alternatively, the seal portion 38 may be, for example, a copper metal seal. As in the first embodiment, a seal function is provided by contact between the held surface 101a of the held portion 101 of the optical member 1 and a holding surface 22a of the holding portion 22, and can be construed as a seal portion. In the second embodiment as well, the held surface 101a of the held portion 101 of the optical member 1, and the holding surface 22a of the holding portion 22 are kept in contact with each other, and this can guarantee a given positioning accuracy between the optical member 1 and holding portion 22.

The optical apparatus 10 includes a pressing portion 50 which presses the optical member 1 and holding portion 22 against each other. Note that pressing the optical member 1 and holding portion 22 against each other amounts to pressing the holding portion 22 relative to the optical member 1, and pressing the optical member 1 relative to the holding portion 22.

The pressing portion 50 includes a first member (for example, a nut) 29 disposed in the concave portion 102 of the optical member 1, and a second member 39 which applies a force to the first member 29 and holding portion 22 in the direction to reduce the interval between the first member 29 and the holding portion 22. The second member 39 can include a bonding member (for example, a male screw) 34 bonded to the first member 29, and a spring 33 disposed between a head portion 34a of the bonding member 34 and the holding portion 22. The spring 33 presses the optical member 1 and holding portion 22 against each other. A through hole 40 is formed in the held portion 101 of the optical member 1 to pass through the held surface 101a and concave portion 102, so the bonding member 34 is bonded to the first member 29 through the through hole 40.

An operation for placing the adhesive material 6 in the space 28 can be done using holes (an injection hole 31 and ejection hole 32) while the holding surface 22a of the holding portion 22, and the held surface 101a of the held portion 101 of the optical member 1 are in contact with each other. More specifically, an adhesive agent can be injected into the space 28, for forming the adhesive material 6, through the injection hole 31. An excess of adhesive agent (that is, an adhesive agent overflowing the space 28) with a volume higher than that of the space 28 can be ejected through the ejection hole 32. After the injection of an adhesive agent into the space 28 ends, the injection hole 31 and ejection hole 32 can be obstructed by an obstructing portion 37. By providing the obstructing portion 37, a gas generated by the adhesive material 6 can be prevented from being emitted to the outside (that is, the space filled with the optical member 1) of the seal portion 38 through the injection hole 31 and ejection hole 32.

Figure 7:
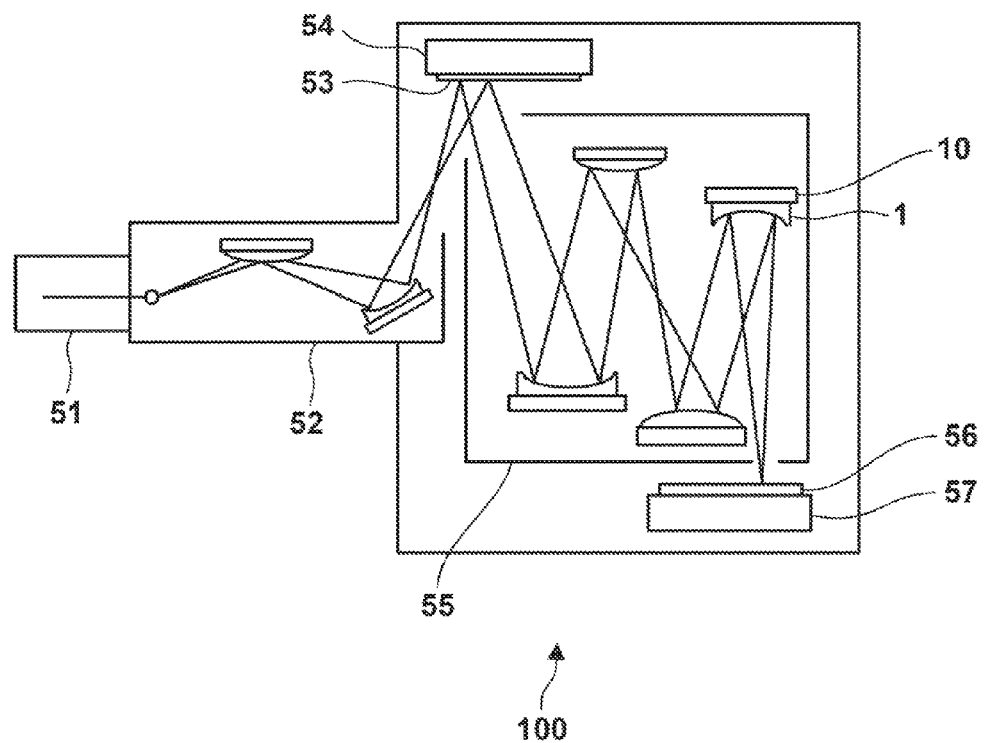
FIG. 7 is a view for explaining an exposure apparatus according to an embodiment of the present invention.

An application example of the optical apparatus 10 according to the first and second embodiments will be described below with reference to FIG. 7 using an exemplary exposure apparatus 100 including an optical system including it. The exposure apparatus 100 includes a light source 51, an illumination optical system 52, an original stage 54 which holds an original 53, a projection optical system 55, and a substrate stage 57 which holds a substrate 56. Although the exposure apparatus 100 serves as an EUV exposure apparatus in this example, it may serve as an exposure apparatus of another type.

In this example, the light source 51 serves as an EUV light source, and the illumination optical system 52 is formed by a plurality of mirrors and a stop. EUV light emitted by the light source 51 illuminates the original 53 through the illumination optical system 52. The EUV light reflected by the original 53 enters the projection optical system 55. The projection optical system 55 can be formed by a plurality of optical apparatuses 10 each including an optical member 1. The EUV light incident on the projection optical system 55 is reflected by the plurality of optical members 1, and strikes the substrate 56. With this operation, the substrate 56 is exposed.

The projection optical system 55 projects the pattern of the original 53 onto the substrate 56 upon being reduced to, for example, ¼ or ⅕ in scale. The original stage 54 and substrate stage 57 are synchronously scanned at a speed ratio equal to the reduction ratio of the projection optical system 55. Although the projection optical system 55 is formed by four optical members 1 in FIG. 7, it may be formed by, for example, six or eight optical members 1.

A method of manufacturing an article according to an embodiment of the present invention will be described next. The article can be, for example, a microdevice such as a semiconductor device. The article can be manufactured by a pre-process of forming a structure such as an integrated circuit on a substrate (for example, a semiconductor substrate), and a post-process of completing, as a product, the structure (for example, an integrated circuit chip) formed on the substrate by the pre-process. The pre-process can include a step of forming a pattern (for example, a latent image) on a substrate, coated with a photosensitive agent, using the above-mentioned exposure apparatus, and a step of developing the substrate having the pattern formed on it in the forming step. The post-process can include an assembly step (dicing and bonding) and packaging step (encapsulation).

While the present invention has been described with reference to exemplary embodiments, it is to be understood, that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-182643, filed Aug. 21, 2012, which is hereby incorporated by reference herein in its entirety.

What is claimed is:

1. An exposure apparatus including an optical system configured to expose a substrate, the optical system comprising:
   an optical member which includes a held portion;
   a holding portion which includes a holding surface in contact with a held surface of the held portion, and holds the optical member;
   a pressing portion which presses the holding surface of the holding portion and the held surface of the held portion against each other; and
   an adhesive material which is filled in a groove formed in the holding surface, the held surface, or the holding surface and the held surface, and adheres the optical member and the holding portion to each other,
   wherein the holding surface and the held surface contact each other in a region surrounding the groove such that the adhesive material is sealed within the groove by the region surrounding the groove.

2. The apparatus according to claim 1, further comprising:
   a hole which communicates with the groove; and
   an obstructing portion which obstructs the hole.

3. The apparatus according to claim 2, wherein the hole includes an injection hole configured to inject an adhesive agent into the groove, and an ejection hole configured to eject an adhesive agent overflowing the groove.

4. The apparatus according to claim 1, wherein the holding portion includes
   a first portion including the holding surface; and
   a second portion opposed to the first portion,
   wherein the pressing portion is attached to the second portion to press the held portion against the holding surface.

5. The apparatus according to claim 1,
   wherein the held portion and a concave portion are formed in the optical member, the concave portion being formed so that the held portion is clamped by the holding portion and the concave portion, and
   wherein the pressing portion includes a first member disposed in the concave portion, and a second member which applies a force to the first member and the holding portion in a direction to reduce an interval between the first member and the holding portion.

6. The apparatus according to claim 5, wherein
   the second member includes a bonding member penetrating the holding portion and the held portion and fixed to the first member, and
   the groove is formed to surround the bonding member.

7. The apparatus according to claim 1, wherein the pressing portion includes an elastic member, and the elastic member presses the holding portion and the optical member against each other.

8. The apparatus according to claim 1, wherein a seal portion is formed by contact between the optical member and the holding portion, the seal portion sealing the adhesive material and disposed around the groove.

9. The apparatus according to claim 8, wherein the seal portion includes an O-ring.

10. The apparatus according to claim 1, wherein the optical system is configured to expose the substrate using EUV (Extreme Ultraviolet) light,
    the optical member including a mirror which reflects the EUV light.

11. The apparatus according to claim 1, wherein the pressing portion presses the holding surface of the holding portion and the held surface of the optical member against each other to prevent expansion of the adhesive material.

12. The apparatus according to claim 1, wherein the optical member includes a plurality of held portions, and each of the plurality of held portions is supported by the holding portion.

13. The apparatus according to claim 1, wherein
    the held portion of the optical member includes a protruding shape, and
    the holding portion includes a through-hole which is penetrated by the held portion and includes the holding surface inside.

14. The apparatus according to claim 1, wherein the pressing portion is arranged to apply a force toward the adhesive material via the held portion of the optical member.

15. The apparatus according to claim 1, wherein the held surface is included in a lower surface of the held portion.

16. The apparatus according to claim 1, wherein the held surface is included in a side surface of the held portion.

17. A method of manufacturing an article, the method comprising the steps of:
    exposing a substrate using an exposure apparatus; and
    developing the substrate exposed in the exposing step,
    wherein the exposure apparatus includes an optical system configured to expose the substrate, the optical system comprising:
    an optical member which includes a held portion;
    a holding portion which includes a holding surface in contact with a held surface of the held portion and holds the optical member;
    a pressing portion which presses the holding surface of the holding portion and the held surface of the held portion against each other; and
    an adhesive material which is filled in a groove formed in the holding surface, the held surface, or the holding surface and the held surface, and adheres the optical member and the holding portion to each other,
    wherein the holding surface and the held surface contact with each other in a region surrounding the groove such that the adhesive material is sealed within the groove by the region surrounding the groove.

* * * * *